United States Patent [19]

Simpson

[11] Patent Number: 5,079,742
[45] Date of Patent: Jan. 7, 1992

[54] READ-ONLY-MEMORY HAVING SECTIONAL OUTPUT LINES WITH RELATED MEMORY ELEMENTS RESPONSIVE TO EARLY AND LATE-OCCURRING INPUT SIGNALS

[75] Inventor: Richard D. Simpson, Bedford, United Kingdom

[73] Assignee: Texas Instruments Incorporated, Dallas, Tex.

[21] Appl. No.: 386,849

[22] Filed: Jul. 28, 1989

[51] Int. Cl.$^5$ ............... G11C 7/00; G11C 11/413
[52] U.S. Cl. .................... 365/104; 365/203; 365/204; 365/233; 365/230.04
[58] Field of Search ............ 365/203, 189.04, 189.09, 365/233, 222, 104, 204, 230.03, 230.04

[56] References Cited

U.S. PATENT DOCUMENTS

| | | | |
|---|---|---|---|
| 3,934,233 | 1/1976 | Fisher et al. | 340/173 |
| 4,021,781 | 5/1977 | Caudel | 340/172 |
| 4,402,043 | 8/1983 | Guttag et al. | 364/200 |
| 4,428,047 | 1/1984 | Hayn et al. | 364/200 |
| 4,439,697 | 3/1984 | Suzuki et al. | 365/204 X |
| 4,520,465 | 5/1985 | Sood | 365/203 |
| 4,583,202 | 4/1986 | Konishi | 365/230.04 X |
| 4,646,265 | 2/1987 | Takamizawa et al. | 365/104 |
| 4,768,171 | 8/1988 | Tada | 365/222 |
| 4,813,021 | 3/1989 | Kai et al. | 365/233 X |
| 4,833,653 | 5/1989 | Mashiko et al. | 365/203 |
| 4,855,957 | 8/1989 | Nogami | 365/189.04 X |
| 4,873,668 | 10/1989 | Winnerl et al. | 365/190 X |
| 4,899,066 | 2/1990 | Aikawa et al. | 365/204 X |
| 4,905,197 | 2/1990 | Urai | 365/204 |
| 4,916,671 | 4/1990 | Ichiguchi | 365/207 |
| 4,933,906 | 6/1990 | Terada et al. | 365/204 X |

Primary Examiner—Alyssa H. Bowler
Attorney, Agent, or Firm—William E. Hiller; Richard Donaldson

[57] ABSTRACT

A read-only memory suitable for use as the control ROM of a microprocessor has each output line divided into first and second parts. Memory elements connected to the first parts are responsive to early-occurring input signals and memory elements connected to the second parts are responsive to late-occurring input signals. Switch means are provided to enable the output signals from the second parts of the output lines to be generated in response to a late-occurring input signal independently of the loading of the memory elements connected to the first parts of the output lines.

25 Claims, 2 Drawing Sheets

READ-ONLY-MEMORY HAVING SECTIONAL OUTPUT LINES WITH RELATED MEMORY ELEMENTS RESPONSIVE TO EARLY AND LATE-OCCURRING INPUT SIGNALS

CROSS REFERENCE TO RELATED APPLICATIONS

All of the following patent applications are cross-referenced to one another, and all have been assigned to Texas Instruments Incorporated. These applications have been concurrently filed and are hereby incorporated in this patent application by reference.

| Attorney Docket # | Ser. No. | Filing date | Title |
|---|---|---|---|
| TI-13495 | 387,568 | 07/28/89 | Video Graphics Display Memory Swizzle Logic and Expansion Circuit and Method |
| TI-14258 | 387,567 | 07/28/89 | Video Graphics Display Memory Swizzle Logic Circuit and Method |
| TI-14356 | 387,459 | 07/28/89 | Graphics Floating Point Coprocessor Having Matrix Capabilities |
| TI-14309 | 387,242 | 07/28/89 | Graphics Processor Trapezoidal Fill Instruction Method and Apparatus |
| TI-14310 | 387,550 | 07/28/89 | Graphic Processor Three-Operand Pixel Transfer Method and Apparatus |
| TI-14311 | 387,119 | 07/28/89 | Graphics Processor Plane Mask Mode Method and Apparatus |
| TI-14312 | 386,956 | 07/28/89 | Dynamically Adaptable Memory Controller For Various Size Memories |
| TI-14313 | 387,472 | 07/28/89 | Graphics Processor Having a Floating Point Coprocessor |
| TI-14314 | 387,553 | 07/28/89 | Register Write Bit Protection Apparatus and Method |
| TI-14315 | 387,569 | 07/28/89 | Graphics Display Split-Serial Register System |
| TI-14316 | 387,455 | 07/28/89 | Multiprocessing Multiple Priority Bus Request Apparatus and Method |
| TI-14317 | 387,325 | 07/28/89 | Processing System Using Dynamic Selection of Big and Little Endian Coding |
| TI-14318 | 386,057 | 07/28/89 | Graphics Processor Nonconfined Address Calculation System |
| TI-14320 | 386,850 | 07/28/89 | Real Time and Slow Memory Access Mixed Bus Usage |
| TI-14399 | 387,479 | 07/28/89 | Graphics Coprocessor Having Imaging Capability |
| TI-14400 | 387,255 | 07/28/89 | Graphics Floating Point Coprocessor Having Stand-Alone Graphics Capability |
| TI-14401 | 387,243 | 07/28/89 | Graphics Floating Point Coprocessor Having Vector Mathematics Capability |
| TIL-13407 | 386,849 | 07/28/89 | Improvements in or Relating to Read-Only Memory |
| TIL-13494 | 387,266 | 07/28/89 | Method and Apparatus for Indicating When a Total in a Counter Reaches a Given Number |

This invention relates to read-only memories, and especially but not exclusively to such memories as are used to provide control signals in data processing means such as an integrated circuit microprocessor.

In a microprocessor an instruction is executed by decoding it to produce a signal on a conductor allocated to that instruction and deriving corresponding control signals for the different parts of the processor to cause it to perform the instructed operation. The control signals are produced by a control read-only memory (CROM) having address input conductors connected to those allocated to the different instructions and data output conductors on which the control signals are generated. Where an instruction requires a plurality of control cycles for its execution, the CROM provides an address input conductor for each cycle.

As microprocessors become more powerful and more complex, the CROM must have a larger number of address input conductors, and at the same time it must be capable of producing the corresponding control signals within a shorter period of time. These two requirements are in conflict because the increased number of address input conductors imposes increased capacitive loadings on the output conductors and thereby tends to slow down the generation of the control signals. In the operation of a microprocessor the control signal output of the CROM is required by a certain time, which means that the CROM must receive its address input signal at an earlier time to allow for the evaluation time of the CROM. Sometimes those address input signals arrive late, for example because their generation depends on the immediately preceding operation, making it essential to keep the evaluation time of the CROM as short as possible.

A usual way of reducing the evaluation time of a ROM is to introduce sense amplifiers into the output conductor. Such a sense amplifier is designed to respond to the initial small change in the voltage on the output conductor as it starts to rise to a standard logic level voltage and to accelerate that rise. The disadvantages with such sense amplifiers arise from their sensitivity which makes them difficult to design, complex, prone to unreliability and not very robust. Another problem is that the parameters of transistors used in such amplifiers must be carefully controlled. It is therefore desirable to avoid the use of such amplifiers if possible.

It is an object of the present invention to provide a read-only memory in which the above difficulty is at least partly alleviated.

According to the present invention there is provided a read-only memory having a plurality of address lines, a plurality of output lines, and a plurality of read-only memory elements located at the junctions of the address lines and the output lines selectively effective to establish different combinations of high and low output signals on the output lines in response to input signals on different input lines, wherein each output line is divided into first and second parts, the input signals including early-occurring input signals and late-occurring input signals, the early-occurring input signals being applied to respective address lines connected to memory elements connected to the first parts of the output lines and the late-occurring input signals being applied to respective address lines connected to memory elements connected to the second parts of the output lines, switch means being provided for enabling output signals to be derived from the second parts of the output lines in response to a late-occurring input signal with the first parts of the output lines disconnected from the second parts of the output lines.

The memory may include means to precharge the output lines in each cycle of operation of the memory and the memory elements may be selectively effective to discharge the part of the output line to which they are connected in response to an input signal. The memory may include separate means for precharging first and second parts of the output lines. A single precharged means may be provided for each output line and the switch means may be arranged to connect together the first and second parts of the output lines during precharging and when an early-occurring input signal is applied to the memory.

The memory may include further switch means respectively effective to connect the output lines to output terminals only after their selective discharge by memory elements.

In one embodiment, the first-mentioned switch means are arranged respectively to connect together the first and second parts of the output lines when an early-occurring input signal is applied to the memory. In a second embodiment, the first-mentioned switch means are arranged to connect the first parts of the output lines to output terminals only when an early-occurring input signal is applied to the memory, and to connect the second parts of the output lines to the output terminals only when a late-occurring input signal is applied to the memory.

The read-only memory may be a control read-only memory for a microprocessor or may be applied for any other purpose where early-occurring and late-occurring input signals are used.

An example of a read-only memory will now be described with reference to the accompanying drawings, of which:

The example of a read-only memory to be described is the control read-only memory of a microprocessor wherein the memory is connected to receive input signals on different input lines according to the operations which the microprocessor is required to perform. The input signals are derived from an instruction decoder and the output signals cause the different data transfer and data processing operations required by the instruction to be performed. The input signals are of two types, early-occurring signals and late-occurring signals. The instruction decoder provides early-occurring signals. The late-occurring signals are derived at least partly from previous outputs of the memory itself during the execution of instructions requiring several cycles of operation of the memory to execute successive stages required by the instruction. Another type of late-occurring input signal could arise from a test inaugurated by an earlier cycle of the memory.

Figure 1:
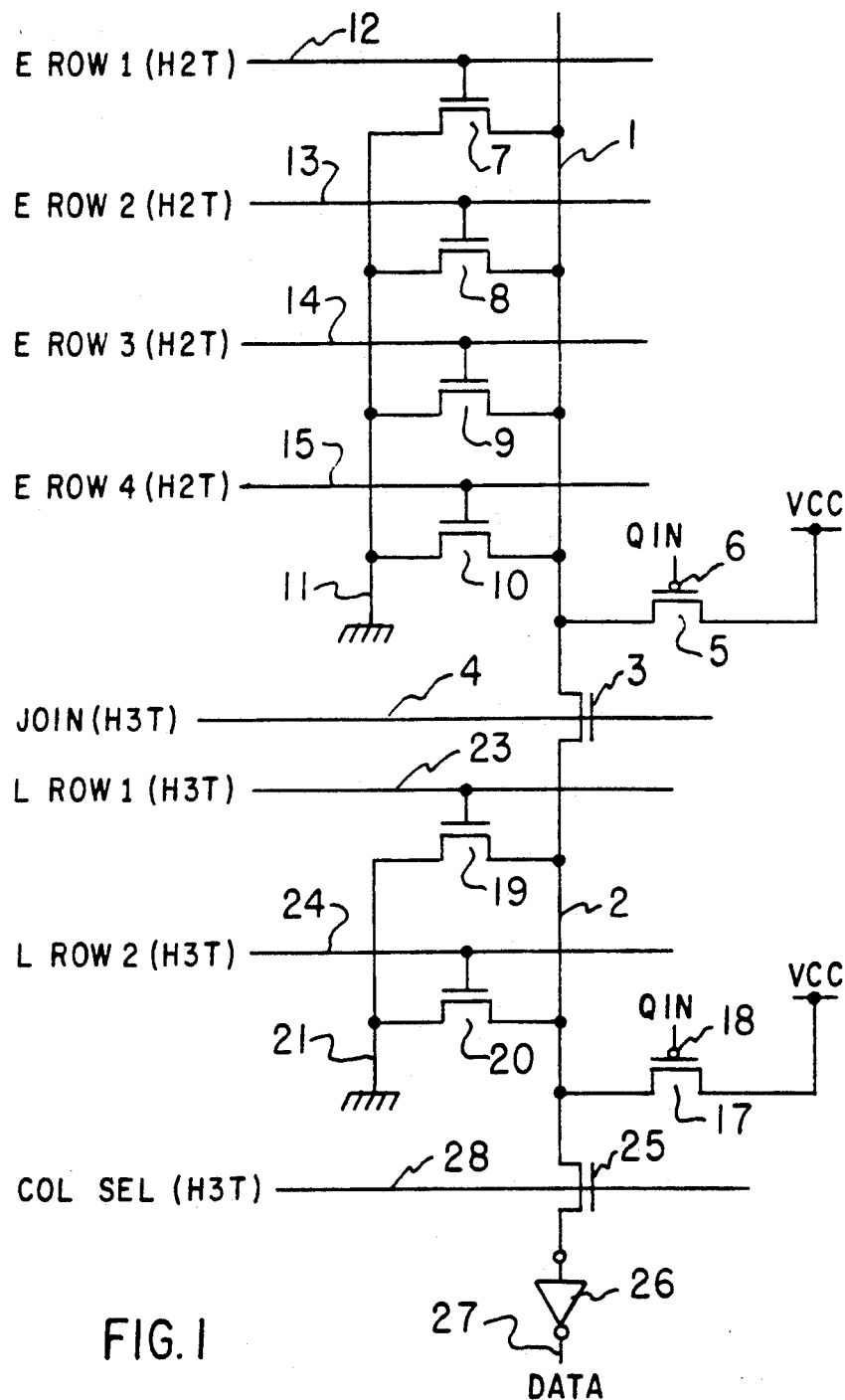
FIG. 1 is a diagram of part of the memory.

FIG. 1 shows in diagrammatic form some of the components connected to a single output line of a read-only memory. The output line itself consists of a first part 1 and a second part 2 joined by a series-connected MOS transistor 3 to the gate of which is applied a control signal JOIN(H3T) via a conductor 4. A transistor 5 controlled by a clock signal QIN applied to its gate 6 serves to precharge the first part 1 of the output line from a supply voltage VCC. Four memory elements are shown having the reference numbers 7, 8, 9 and 10. Each memory element consists of a single transistor the drain of which is connected to the first part 1 of the output line and the source of which is connected to ground via a conductor 11. The gates of the memory elements 7, 8, 9 and 10 are respectively connected to input lines 12, 13, 14 and 15, to which in the operation of the memory input signals EROW1(H2T), EROW2(H2T), EROW3(H2T) and EROW4(H2T) are respectively applied. In practice, the memory would include many more elements connected to the first part of each output line than the four shown in FIG. 1, but only four are shown in the drawing for the sake of clarity. When the memory is manufactured the transistor forming the active component of each memory element is functional, but when the memory is programmed the transistors forming certain of the memory elements are disabled.

A transistor 17 is provided to precharge the second part 2 of the output line having the signal QIN applied to its gate electrode 18. The control path of the transistor 17 is connected from the output line part 2 to the voltage supply VCC. Two memory elements 19 and 20 are connected between the output line part 2 and ground via a conductor 21. The gate electrodes of the elements 19 and 20 are respectively connected to input lines 23 and 24 to which input signals LROW1(H3T) and LROW2(H3T) are respectively applied. As with the memory elements 7, 8, 9 and 10 mentioned above, the memory elements 19 and 20 consist of single transistors and are representative only of a larger plurality of such elements connected from the second part of the output line to ground. After manufacture of the memory the transistors forming the elements 19 and 20 are selectively disabled by the programming of the memory.

The second part 2 of the output line is connected through a series-connected transistor 25 to the input of an output amplifier 26 which produces an output signal of the memory on a conductor 27. The gate of the transistor 25 is connected to a conductor 28 to which is applied a column or output line select signal COL-SEL(H3T).

Figure 2:
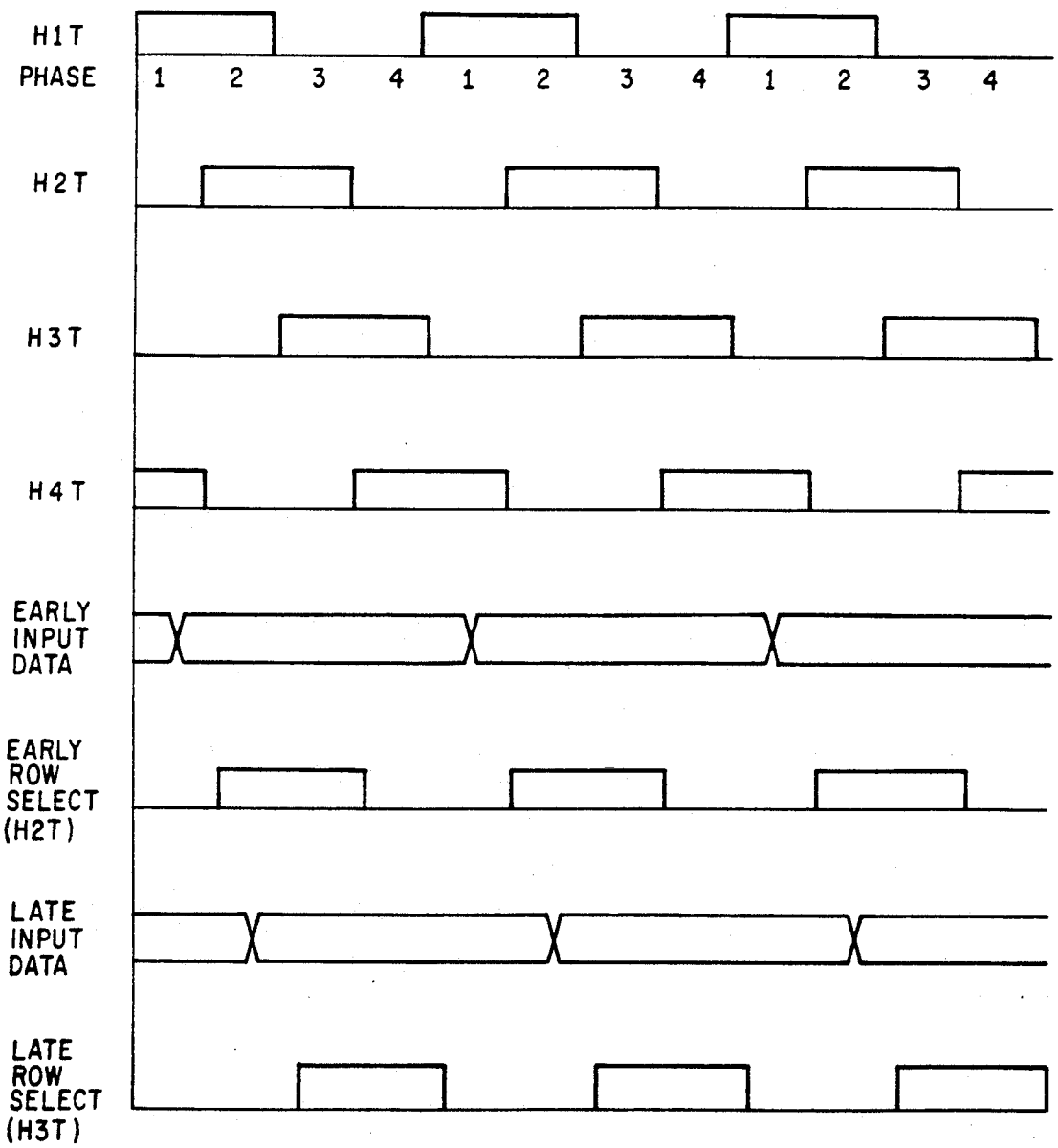
FIG. 2 shows waveforms of various signals occurring in the memory.

As mentioned above, the example of the memory shown in FIG. 1 is a control read-only memory for a microprocessor. The microprocessor has a four-phase clock pulse circuit consisting of four staggered square waves separated by equal phase shifts. The four clock phases are conventionally termed H1T, H2T, H3T and H4T and their waveforms are shown in FIG. 2. The input signals to the memory are subdivided into early-occurring input signals and late-occurring input signals. The early-occurring input signals are derived from early input data signals which change during phase 1, the first half of the high part of the H1T clock signal. Since the data changes during phase 1, its level is valid during phases 2 and 3. The early-occurring input signals applied to the memory are derived from the early input data gated by the early row select signal which is the same as the clock signal H2T having a high level in phases 2 and 3. The early row select signal is used to gate the early input data and is applied as an input signal to the memory. The late input data changes during phase 2 and therefore has a level which is valid during phases 3 and 4. The late input data is gated by a late row select signal corresponding to clock signal H3T to produce the late-occurring input signals to the memory.

In the operation of the memory shown in FIG. 1, the first and second parts 1 and 2 of the output line are precharged during phase 1 in response to the precharge signal QIN which causes the transistors 5 and 17 to conduct. At this time all of the other transistors shown are non-conducting. An input signal is then applied to the memory. If it is an early-occurring input signal, it goes high for phases 2 and 3 and is applied to one of the plurality of transistors 7, 8, 9 and 10 connected to the first part 1 of the output line. If the programming of the memory is such that the transistor forming the memory element is operational, then the first part 1 of the output lines is discharged to ground. Otherwise the part 1 maintains the voltage to which it was precharged. At phase 3, the signal JOIN(H3T) is applied to the conductor 4 and causes the transistor 3 to become conducting. The discharging of the part 1 of the output line by a memory element continues during phase 3 so that the second part 2 of the output line is also discharged. The signal JOIN(H3T) may be derived by suitable logic such as an OR-gate from the early-occurring input signals applied to the input lines 12, 13, 14 and 15. Also starting in phase 3 and continuing for the high level period of the clock signal H3T, the column select signal COLSEL(H3T) is applied to the conductor 28 causing the transistor 25 to become conducting so that the high or low voltage on the second part 2 of the output line, depending on whether or not it was discharged through the conducting transistor 3 and one of the elements 7 to 10, is applied to the input of amplifier 26 to produce a data output signal on the conductor 27.

If the input signal to the memory is a late-occurring one which would be applied to one or the other of the input lines 23 and 24, then it will not reach a high level until the start of phase 3. If the programming of the memory is such that the transistor forming the memory element 19 or 20 is rendered conducting by the input signal, then the second part 2 of the output line is discharged through that element so that a low level signal is applied through the transistor 25 to the amplifier 26. Under these circumstances, the transistor 3 remains non-conducting because when the input signal is a late-occurring one the signal JOIN(H3T) is not produced. This means that the first part 1 of the output line is disconnected from the second part 2 with the result that the capacitance of the first part and of the components connected to it does not have to be discharged by a memory element rendered conducting by a late input signal. Since the memory elements 19 and 20 can only be rendered conducting at the start of phase 3 and the transistor 25 is also rendered conducting at the same time, there will be a short interval of time at the start of phase 3 when the voltage on the second part 2 will be high before it can be discharged by the memory element. In fact, this time is sufficiently short that if a low level output is to be produced at the input to the amplifier 26, then the short voltage spike which occurs will not be of sufficient amplitude to cross the threshold value and be recognised as a high level signal.

In a modification of the circuit shown in FIG. 1, one of the precharging transistors 5 and 17 may be omitted and the transistor 3 rendered conducting during the precharging phase (phase 1) so that both parts 1 and 2 are precharged through a single transistor.

In an alternative construction of the memory, the first and second parts 1 and 2 of the output line are separately connected through gating transistors to the input of the amplifier 26 and the joining transistor 3 is omitted.

I claim:

1. A read-only-memory having a plurality of address lines, a plurality of output lines, and a plurality of read-only memory elements located at the junctions of the address lines and the output lines selectively effective to establish different combinations of high and low output signals on the output lines in response to input signals on different input lines, wherein each output line is divided into first and second parts, the input signals including early-occurring input signals and late-occurring input signals, the early-occurring input signals being applied to respective address lines connected to memory elements connected to the first parts of the output lines and the late-occurring input signals being applied to respective address lines connected to memory elements connected to the second parts of the output lines, switch means being provided for enabling output signals to be derived from the second parts of the output lines in response to a late-occurring input signal with the first parts of the output lines disconnected from the second parts of the output lines.

2. A memory according to claim 1 wherein means are provided to precharge the output lines in each cycle of operation of the memory, and the memory elements are selectively effective to discharge the parts of the output lines to which they are connected in response to an input signal.

3. A memory according to claim 2 wherein separate means are provided to precharge the first and second parts of the output lines.

4. A memory according to claim 2 including precharge means for each output line and wherein the switch means are arranged respectively to connect together the first and second parts of the output lines during precharging and when an early-occurring input signal is applied to the memory.

5. A memory according to claim 2 including a plurality of further switch means respectively effective to connect the output lines to output terminals after selective discharging of the output lines by memory elements.

6. A memory according to claim 1 wherein the switch means are arranged respectively to connect together the first and second parts of the output lines when an early-occurring input signal is applied to the memory.

7. A memory according to claim 1 wherein the switch means are arranged to connect the first parts of the output lines to output terminals when an early-occurring input signal is applied to the memory, and to connect the second parts of the output lines to the output terminals when a late-occurring input signal is applied to the memory.

8. A memory according to claim 1 wherein each memory element includes a normally non-conducting transistor which is selectively programmed to become conducting in response to an input signal or to remain non-conducting.

9. A read-only-memory according to claim 1 wherein the first parts of the output lines are cascaded to the second parts of the output lines separated by the switch means.

10. The read-only memory according to claim 1 further including a decoder for decoding the early-occurring input signals and the late-occurring input signals.

11. A memory comprising:
first memory elements having corresponding first memory control lines;
a first data line connected to said first memory elements;
said first memory elements being responsive to memory control signals on the first memory control lines to that a memory control signal on a particular one of said first memory control lines discharges said first data line via the first memory element corresponding to the particular first memory control line;
second memory elements having corresponding second memory control lines;

a second data line connected to said second memory elements;

said second memory elements being responsive to memory control signals on the second memory control lines so that a memory control signal on a particular one of said second memory control lines discharges said second data line via the second memory element corresponding to the particular second memory control line;

a switch element connected to said first and second data lines and having a switch control line to control said switch element operative to selectively provide a connection between said first and second data lines;

an output element connected to said second data line operative to receive an output signal from said second data line; and a circuit operative to generate memory control signals and a switch control signal to control the output signal wherein:

the switch element in response to the occurrence of the switch control signal on said switch control line provides a connection between said first and said second data lines; and memory control signals on the particular one of said first memory control lines discharging said first data line via the first memory element corresponding to the particular first memory control line and also discharging said second data line via the first memory element corresponding to the particular first memory control line when the switch control signal is present on the switch control line of said switch element to provide a connection between said first and said second data lines.

12. A memory as set forth in claim 11, wherein said circuit generates memory control signals on the particular one of said second memory control lines to discharge said second data line via the second memory element corresponding to the particular second memory control line; and the switch control signal on the switch control line of the switch element being turned off for disconnecting said first and second data lines.

13. A memory as set forth in claim 11, further comprising a charging circuit responsive to a charge control signal for charging said first and said second data lines.

14. A memory as set forth in claim 11, further comprising first and second charging circuits respectively responsive to first and second charge control signals for charging said first and second data lines.

15. A memory as set forth in claim 14, wherein the first and second charge control signals occur simultaneously for actuating said first and second charging circuits to charge the first and second data lines simultaneously.

16. A memory as set forth in claim 11, wherein said output element connected to said second data line includes an output buffer responsive to an output control signal.

17. A memory as set forth in claim 11, wherein said first and second memory elements are selectively programmable so as to provide functional memory elements representative of one of the binary digits "1" and "0" and non-functional memory elements representative of the other of the binary digits "1" and "0";

respective functional memory elements becoming conductive in response to an input signal provided as a memory control signal on a particular one of said memory control lines for discharging the corresponding one of said first and second data lines to which the functional memory element related to the particular one of the memory control lines is connected;

whereby the memory is a read-only-memory.

18. A method of operating a memory comprising the steps of:

generating a first memory element control signal for selectively actuating a first memory element connected to a first data line;

selectively discharging the first data line via the actuated first memory element in response to the generation of the first memory element control signal when the first memory element is an operable memory element and maintaining a voltage level on the first data line when the first memory element is inoperable and remains non-actuated in response to the generation of the first memory element control signal corresponding thereto;

generating a second memory element control signal for selectively actuating a second memory element connected to a second data line;

selectively discharging the second data line via the actuated second memory element in response to the generation of the second memory element control signal when the second memory element is an operable memory element and maintaining a voltage level on the second data line when the second memory element is inoperable and remains non-actuated in response to the generation of the second memory element control signal corresponding thereto;

closing a switch between said first and second data lines in response to the generation of a switch control signal applied thereto for providing a connection between said first and second data lines;

discharging both of said first and second data lines via an actuated first memory element in response to the provision of a first memory control signal to an operable first memory element actuating the first memory element when the first and second data lines are connected by the closing of the switch therebetween; and providing an output signal from the selective discharging of the first and second data lines in response to selective actuation of said first and second memory elements.

19. A method of operating a memory as set forth in claim 18, further including simultaneously precharging said first and second data lines prior to the generation of said first and second memory element control signals.

20. A method of operating a memory as set forth in claim 18, further including precharging said first data line via a first charging circuit; and precharging said second data line via a second charging circuit.

21. A method of operating a memory as st forth in claim 20, wherein the precharging of said first and second data lines occurs simultaneously.

22. A method of operating a memory as set forth in claim 18, further including discontinuing the switch control signal for the switch between said first and second data lines to disconnect said second data line form said first data line; and deriving an output signal form said second data line in response to a second memory element control signal provided to a second memory cell when said second data line is disconnected from said first data line.

23. A read-only-memory comprising:

a plurality of address lines;

a plurality of output lines, each of said output lines respectively crossing said plurality of address lines to provide intersections between each of said address lines and each of said output lines;

a plurality of read-only-memory elements respectively located at the intersections of the address lines and the output lines;

said plurality of read-only-memory elements being selectively programmable so as to provide functional memory elements representative of one of the binary digits "1" and "0" and non-function memory elements representative of the other of the binary digits "1" and "0";

said plurality of read-only-memory elements being selectively actuated in response to input signals on the address lines to provide different combinations of high and low output signals representative of binary digits "1" and "0", respectively;

each of said plurality of output lines being defined by a first output line part, a second output line part, and an output line extension;

first switch means operably connected to said first and second output line parts for each of said plurality of output lines and alternatively disposable in closed and open positions, said first switch means being responsive to a switch control signal to assume a closed position for connecting said first and second output line parts to each other and disconnecting said first and second output line parts from each other when in an open position in the absence of the switch control signal;

second switch means operably connected to said second output line part and said output line extension for each of said plurality of output lines and alternatively disposable in closed and open positions, said second switch means being responsive to an output control signal to assume a closed position for connecting said second output line part to said output line extension and disconnecting said second output line part from said output line extension when in an open position in the absence of the output control signal;

said plurality of read-only-memory elements including a first group of read-only-memory elements connected to said first output line part of each of said plurality of output lines, and a second group of read-only-memory elements connected to said second output line part of each of said plurality of output lines;

said plurality of address lines including a first group of address lines corresponding to each of said first output line parts and connected to corresponding read-only-memory elements of said first group of read-only-memory elements for each of said first output line parts, and a second group of address lines corresponding to each of said second output line parts and connected to corresponding read-only-memory elements of said second group of read-only-memory elements for each of said second output line parts;

means for precharging said first and second output line parts of each of said plurality of output lines in a beginning stage of each cycle of memory operation; and the functional memory elements of said read-only-memory elements being respectively effective to discharge the corresponding one of said first and second output line parts of the output line to which they are connected in response to an input signal selectively applied to the address line connected to a particular read-only-memory element.

24. A read-only-memory as set forth in claim 23, wherein input signals as applied to said plurality of address lines include early-occurring input signals and late-occurring input signals;

the early-occurring input signals being applied to respective address lines included in said first group of address lines connected to corresponding read-only-memory elements of said first group of read-only-memory elements and corresponding to each of said first output line parts;

the late-occurring input signals being applied to respective address lines included in said second group of address lines connected to corresponding read-only-memory elements of said second group of read-only-memory elements and corresponding to each of said second output line parts; and said second switch mean being responsive to the output control signal for a selected output line of said plurality of output lines for connecting said second output line part to said output line extension to produce an output signal on said output line extension from said second output line part in response to a late-occurring input signal applied to one of said second group of address lines connected to a particular read-only-memory element of said second group of read-only-memory elements when said first switch means is in an open position disconnecting said first output line part from said second output line part.

25. A read-only-memory as set forth in claim 23, wherein said precharging means includes a first precharging means for precharging said first output line pats of each of said plurality of output lines, and a second precharging means separate from said first precharging means for precharging said second output line parts of each of said plurality of output lines.

* * * * *